United States Patent
Wang et al.

(10) Patent No.: US 9,620,618 B2
(45) Date of Patent: Apr. 11, 2017

(54) TRANSISTOR AND METHOD FOR FORMING THE SAME

(71) Applicant: Taiwan Semiconductor Manufacturing Company Limited, Hsinchu (TW)

(72) Inventors: Chien-Hsun Wang, Hsinchu (TW); Mao-Lin Huang, Hsinchu (TW); Chun-Hsiung Lin, Hsinchu County (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

(21) Appl. No.: 15/015,196

(22) Filed: Feb. 4, 2016

(65) Prior Publication Data

US 2016/0155817 A1 Jun. 2, 2016

Related U.S. Application Data

(62) Division of application No. 14/055,976, filed on Oct. 17, 2013, now Pat. No. 9,276,084.

(51) Int. Cl.
| | |
|---|---|
| *H01L 29/66* | (2006.01) |
| *H01L 29/06* | (2006.01) |
| *H01L 29/78* | (2006.01) |
| *H01L 29/08* | (2006.01) |
| *H01L 29/10* | (2006.01) |

(52) U.S. Cl.
CPC .... *H01L 29/66522* (2013.01); *H01L 29/0847* (2013.01); *H01L 29/0895* (2013.01); *H01L 29/1033* (2013.01); *H01L 29/78* (2013.01)

(58) Field of Classification Search
CPC .......... H01L 2924/00; H01L 29/66462; H01L 29/2003; H01L 29/7787; H01L 29/402; H01L 29/1029; H01L 29/66795; H01L 29/7848; H01L 29/812
USPC .................................. 257/77, 192, 194, 195
See application file for complete search history.

(56) References Cited

U.S. PATENT DOCUMENTS

| | | | |
|---|---|---|---|
| 2001/0013604 A1* | 8/2001 | Hase | H01L 21/28587 257/12 |
| 2010/0252862 A1* | 10/2010 | Ko | H01L 29/1054 257/192 |
| 2011/0092057 A1* | 4/2011 | Suvorov | H01L 21/0465 438/522 |
| 2011/0147708 A1* | 6/2011 | Radosavljevic | B82Y 10/00 257/24 |
| 2013/0020707 A1 | 1/2013 | Or-Bach et al. | |

* cited by examiner

*Primary Examiner* — David Vu
*Assistant Examiner* — Jonathan Han
(74) *Attorney, Agent, or Firm* — Jones Day (57) ABSTRACT

A method for forming a transistor is provided. The method includes: forming a channel layer over a substrate; forming a barrier layer between the channel layer and the substrate; forming a recess that extends into the barrier layer through the channel layer; and forming a source layer in the recess.

20 Claims, 6 Drawing Sheets

TRANSISTOR AND METHOD FOR FORMING THE SAME

CROSS-REFERENCE TO A RELATED APPLICATION

This application is a divisional application of U.S. patent application Ser. No. 14/055,976, filed Oct. 17, 2013, which is incorporated herein by reference in its entirety.

FIELD

This disclosure relates generally to semiconductor processes, and, more particularly, to a transistor and method for forming the same.

BACKGROUND

Operation speed of the transistors is related to the on-resistance between the source and the drain of the transistor. Therefore, lowering the on-resistance may significantly speed up an integrated circuit with millions of transistors.

DETAILED DESCRIPTION

Reference will now be made in detail to exemplary embodiments, which are illustrated in the accompanying drawings. Wherever possible, the same reference numbers will be used throughout the drawings to refer to the same or like parts.

In the exemplary embodiment of the disclosure, the substrate is formed of Silicon and the channel layer is formed of III-V compounds (such as Indium arsenide (InAs), Indium gallium arsenide (InGaAs) or Gallium indium antimonide (InGaSb)). For example, assuming the first set having Germanium (Ge), Gallium Arsenide (GaAs) and Aluminium Arsenide (AlAs), the second set having Indium phosphide (InP) and Indium gallium arsenide (InGaAs(In=0.53, Ga=0.47)), and the third set having Indium arsenide (InAs), Gallium antimonide (GaSb) and Aluminium antimonide (AlSb), a lattice mismatch between the first set and Silicon is about four percent; a lattice mismatch between the second set and Silicon is about eight percent; and a lattice mismatch between the third set and Silicon is about twelve percent. The lattice mismatch between the substrate and the channel layer may degrade adherence between layers so that at least one buffer layer is utilized therebetween to at least partially alleviate this issue.

In addition, Schottky Barrier Height (SBH) of the materials used in the exemplary embodiment may affect contact resistance between the materials. For example, In(0.85)Ga(0.15)As has a SBH of 0 eV. In(0.53)Ga(0.47)As has a SBH of +0.28 eV. InAs has a SBH of −0.07 eV. GaAs has a SBH of +0.96 eV. The lower the Schottky Barrier Height, the better the contact resistance. So, proper selection of the materials in view of SBH may improve the contact resistance.

Figure 1:
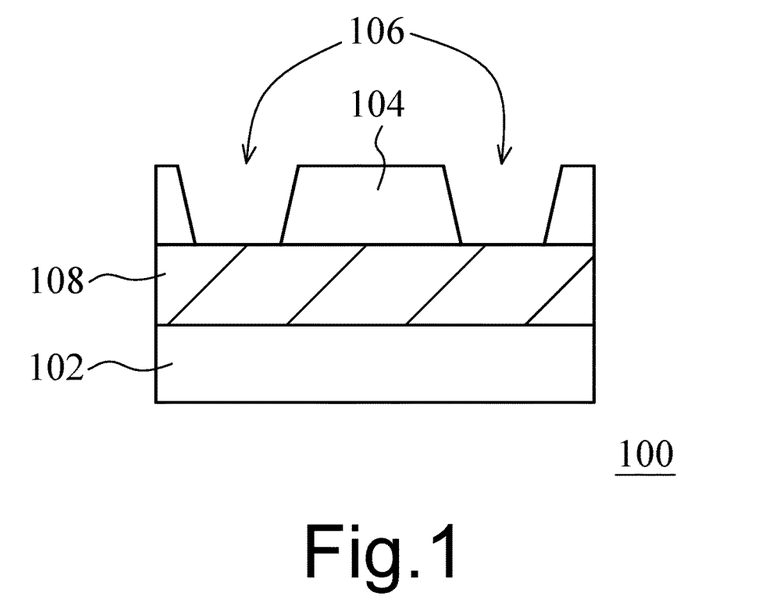
FIG. 1 is a sectional view illustrating an exemplary structure for forming a transistor according to an exemplary embodiment of the disclosure.

FIG. 1 is a sectional view illustrating an exemplary structure for forming a transistor according to an exemplary embodiment of the disclosure. As shown in FIG. 1, a substrate 102 is provided in a transistor 100. A channel layer 104 is formed over the substrate 102. A barrier layer 108 is formed between the channel layer 104 and the substrate 102. A mask (not shown) is used to define an etching region for the channel layer 104. Then, a portion of the channel layer 104 is removed by, for example, an etching process. A first recess 106 is formed accordingly. The substrate 102 is formed of Silicon or III-V compounds. The channel layer 104 is formed of lightly doped InGaAs or non-doped InGaAs. The barrier layer 108 is formed of InP, InAlAs or AlAsSb. The thickness of the channel layer 104 may be about 5-50 nanometers. The thickness of the barrier layer 108 may be about 50-500 nanometers.

Figure 2:
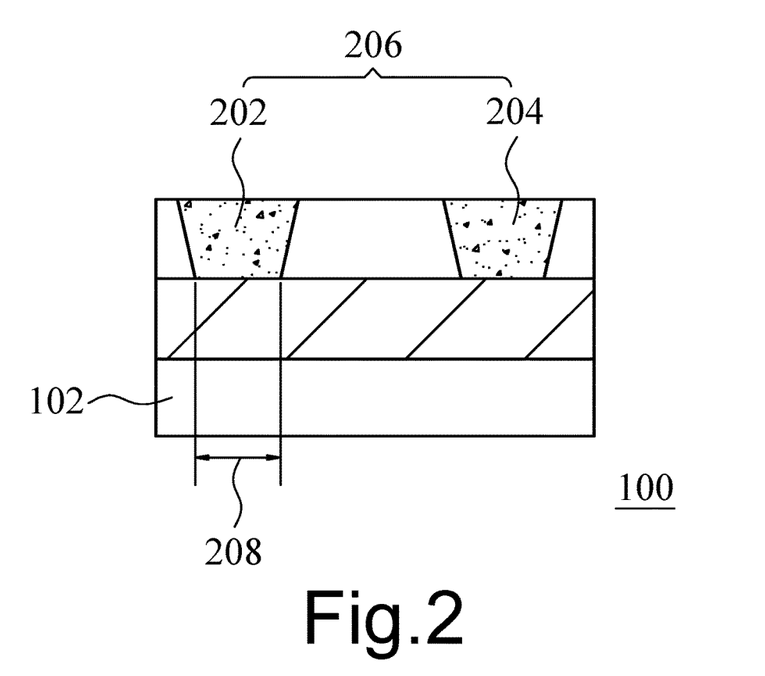
FIG. 2 is a sectional view illustrating forming of a source layer according to the exemplary embodiment of the disclosure.

FIG. 2 is a sectional view illustrating forming of a source layer according to the exemplary embodiment of the disclosure. As shown in FIG. 2, a source layer 206 is formed over the substrate 102 and is formed in the first recess 106. The source layer 206 includes a source 202 and a drain 204. The source layer 206 comprises highly doped III-V compounds, for example, highly doped InGaAs. The width 208 of the source 202 may be about 10-100 nanometers.

Figure 3:
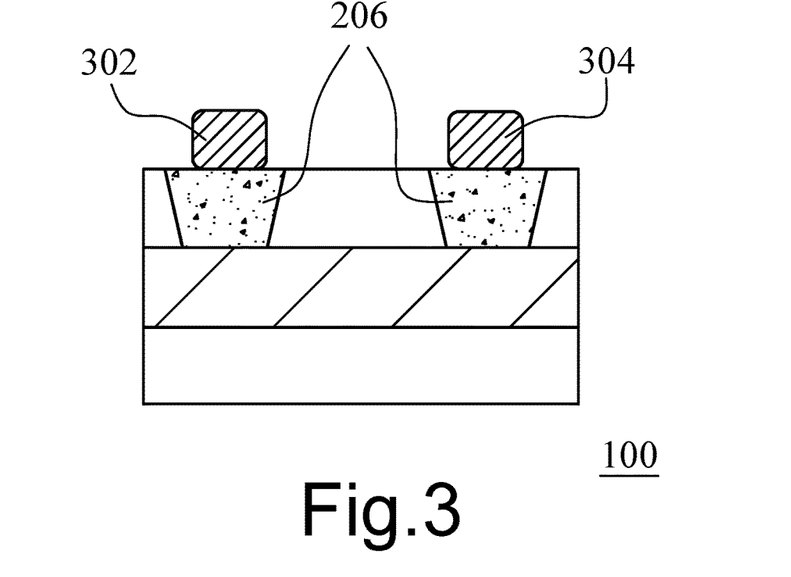
FIG. 3 is a sectional view illustrating forming of a source terminal and a drain terminal according to the exemplary embodiment of the disclosure.

FIG. 3 is a sectional view illustrating forming of a source terminal and a drain terminal according to the exemplary embodiment of the disclosure. A source terminal 302 and a drain terminal 304 are formed over the source layer 206. The source terminal 302 and the drain terminal 304 are formed of, for example, metal or metal alloy. The source terminal 302 and the drain terminal 304 are connected to the source layer 206 through Ohmic contacts.

Figure 4:
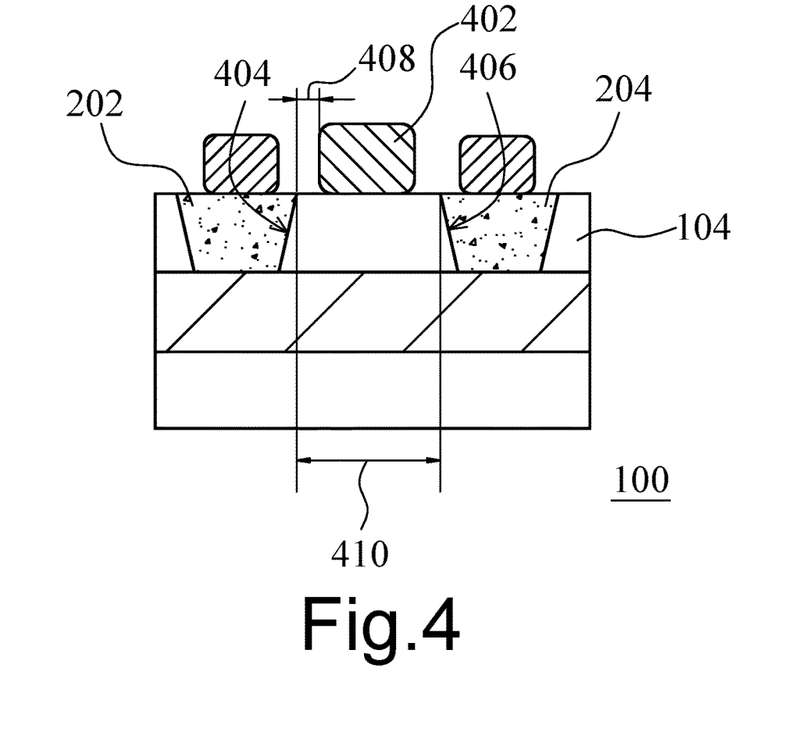
FIG. 4 is a sectional view illustrating forming of a gate stack according to the exemplary embodiment of the disclosure.

FIG. 4 is a sectional view illustrating forming of a gate stack according to the exemplary embodiment of the disclosure. A gate stack 402 is formed over the channel layer 104. The transistor 100 is formed accordingly. The gate stack 402 is formed of metal (such as tantalum, tungsten, tantalum nitride, and titanium nitride) and high-k dielectrics. The distance 410 between the surface 404 of the source 202 and the surface 406 of the drain 204 and the distance 408 between the surface 404 of the source 202 and the gate stack 402 influence the on-resistance of the transistor 100. In the exemplary embodiment, the distance 410 may be short, for example, about 20-30 nanometers or 200-300 nanometers, and the distance 408 may be short as well, for example, about 5-500 nanometers so that the on-resistance of the transistor 100 is lower and the operation speed of the transistor 100 is increased.

Figure 5:
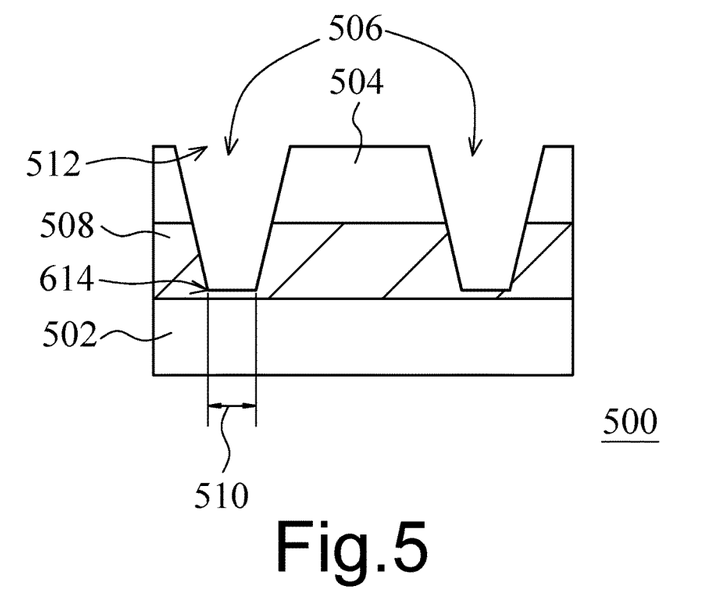
FIG. 5 is a sectional view illustrating an exemplary structure for forming a transistor according to an exemplary embodiment of the disclosure.

FIG. 5 is a sectional view illustrating an exemplary structure for forming a transistor according to an exemplary embodiment of the disclosure. As shown in FIG. 5, a substrate 502 is provided in a transistor 500. A channel layer 504 is formed over the substrate 502. A barrier layer 508 is formed between the channel layer 504 and the substrate 502. A mask (not shown) is used to define an etching region for the channel layer 504 and the barrier layer 508. Then, a portion of the channel layer 504 and the barrier layer 508 is removed by, for example, an etching process. A first recess 506 is formed accordingly. The substrate 502 is formed of Silicon or III-V compounds. The thickness of the channel layer 504 may be about 5-50 nanometers. The thickness of the barrier layer 508 may be about 50-500 nanometers. In another exemplary embodiment, a first buffer layer (not shown) is formed between the barrier layer 508 and the substrate 502. A second buffer layer (not shown) is formed between the first buffer layer (not shown) and the substrate 502. The first buffer layer and the second buffer layer are optional. When the substrate 502 is formed of III-V compounds, the first buffer layer and the second buffer layer may not be necessary. Additionally, in the exemplary embodiment, the barrier layer 508 is patterned to make a width 510 of the recess 506 gradually upward increase from near a base 614 of the recess 506 toward a top 512 of the recess 506.

Figure 6:
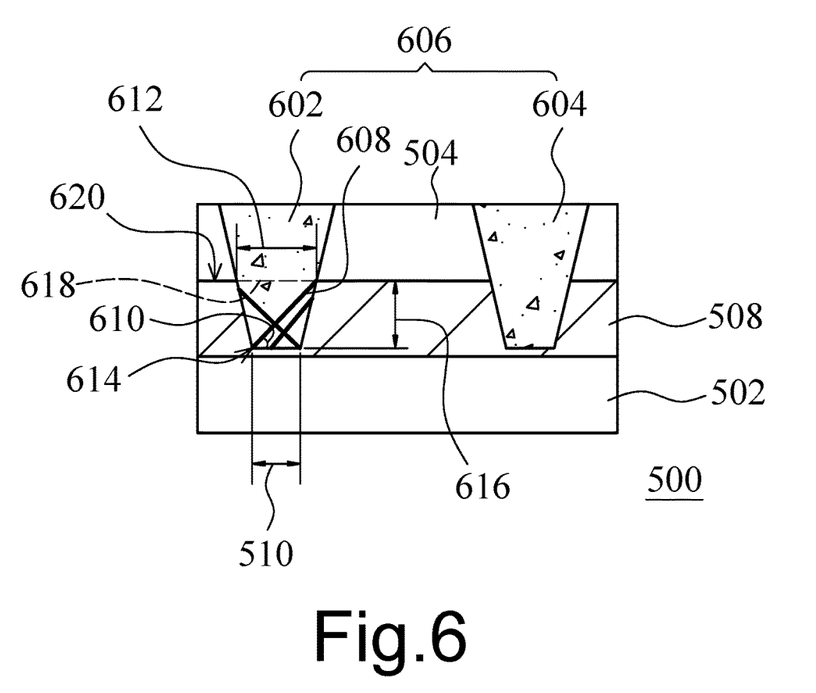
FIG. 6 is a sectional view illustrating forming of a source layer according to the exemplary embodiment of the disclosure.

FIG. 6 is a sectional view illustrating forming of a source layer according to the exemplary embodiment of the disclosure. As shown in FIG. 6, a source layer 606 is formed over the substrate 502 and is formed in the first recess 506. The source layer 606 includes a source 602 and a drain 604. The source layer 606 comprises highly doped III-V compounds, for example, highly doped InGaAs. The width 510 of the source 602 may be about 10-100 nanometers.

Defects 608 in the source layer 606 may occur due to misfit dislocation. The angle 610 between the direction of the defects 608 and the base 614 of the recess may be less than about 60 degrees. In a case that the angle 610 is 60 degrees and the defects 608 grows from the corner, then the depth 616 between a bottom surface 620 of the channel layer 504 and a base 614 of the recess may be more than 1.4 times a width 612 of the section 618 of the recess intersecting the bottom surface 620 of the channel layer 504. The defects 608 may not appear above the bottom surface 620 of the channel layer 504 so as to provide good contact between the source layer 606 and the channel layer 504. This lowers the on-resistance of the transistor 500. In another exemplary embodiment, the depth 616 may be more than 2 times the width 612. The above are merely exemplary embodiments, and after reading this disclosure, those of ordinary skill in the art will appreciate the other embodiments and possible.

Figure 7:
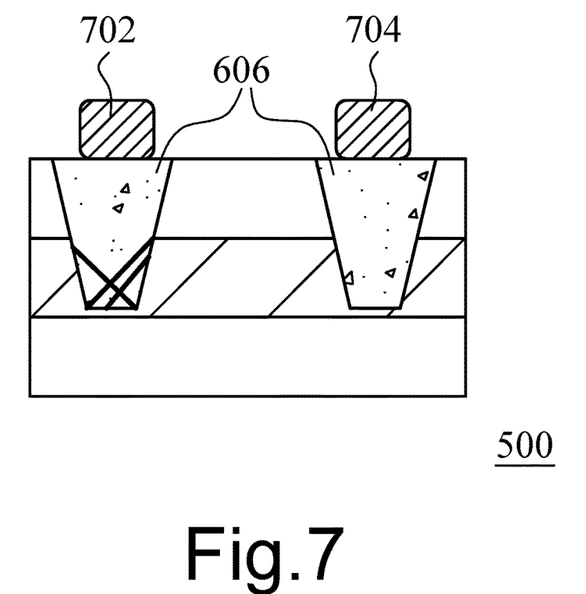
FIG. 7 is a sectional view illustrating forming of a source terminal and a drain terminal according to the exemplary embodiment of the disclosure.

FIG. 7 is a sectional view illustrating forming of a source terminal and a drain terminal according to the exemplary embodiment of the disclosure. A source terminal 702 and a drain terminal 704 may be formed over the source layer 606. The source terminal 702 and the drain terminal 704 are formed of, for example, metal or metal alloy. The source terminal 702 and the drain terminal 704 are connected to the source layer 606 through Ohmic contacts.

Figure 8:
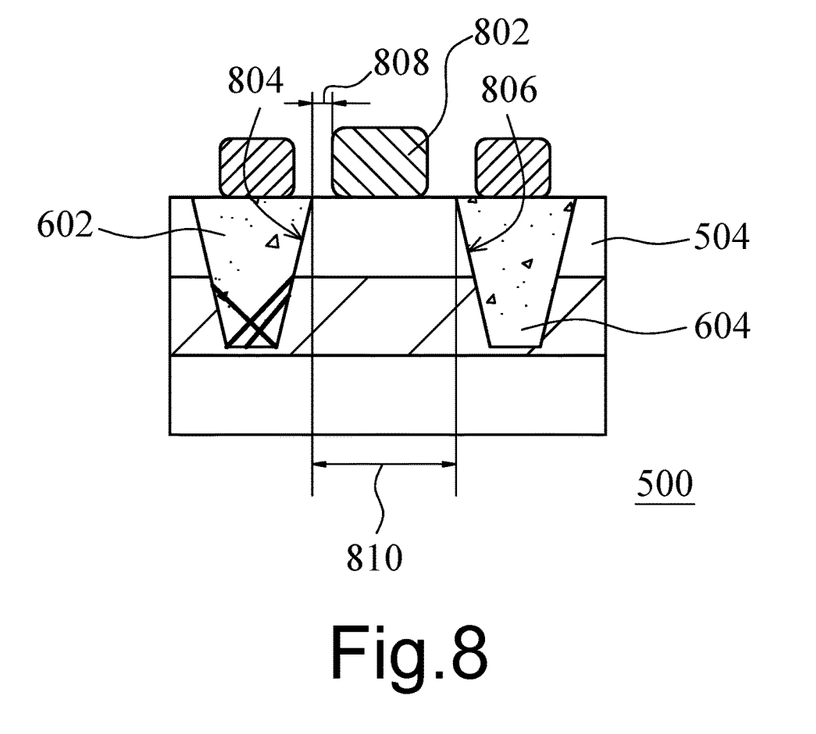
FIG. 8 is a sectional view illustrating forming of a gate stack according to the exemplary embodiment of the disclosure.

FIG. 8 is a sectional view illustrating forming of a gate stack according to the exemplary embodiment of the disclosure. A gate stack 802 is formed over the channel layer 504. The transistor 500 is formed accordingly. The gate stack 802 is formed of metal (such as tantalum, tungsten, tantalum nitride, and titanium nitride) and high-k dielectrics. The distance 810 between the surface 804 of the source 602 and the surface 806 of the drain 604 and the distance 808 between the surface 804 of the source 602 and the gate stack 802 influence the on-resistance of the transistor 500. In the exemplary embodiment, the distance 810 may be short which is about 20-30 nanometers or 200-300 nanometers, and the distance 808 may be short as well which is about 5-500 nanometers so that the on-resistance of the transistor 500 is lower and the operation speed of the transistor 500 is increased.

Figure 9:
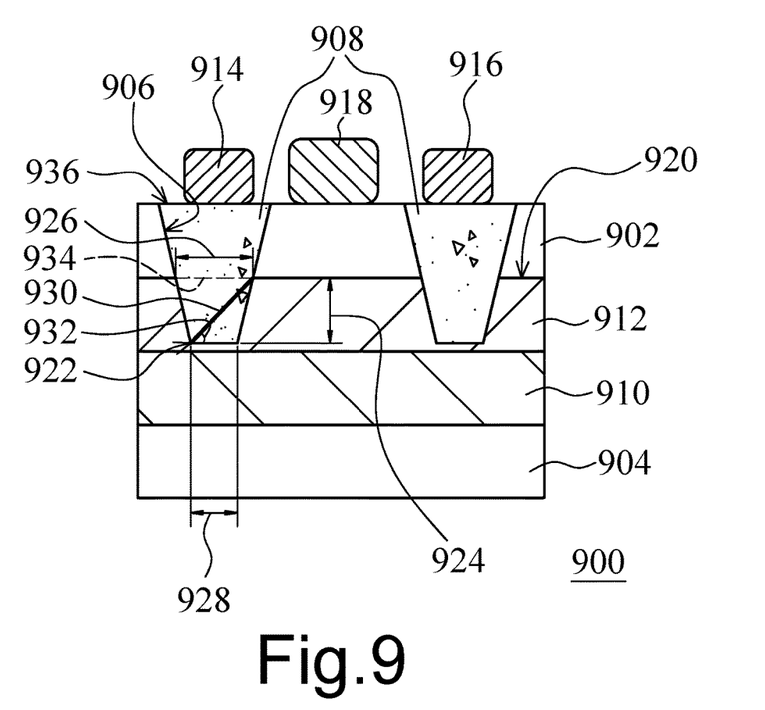
FIG. 9 is a sectional view of a transistor according to an exemplary embodiment of the disclosure.

FIG. 9 is a sectional view of a transistor according to an exemplary embodiment of the disclosure. As shown in FIG. 9, the transistor 900 includes a channel layer 902 and a source layer 908. The channel layer 902 is disposed over a substrate 904 and has a recess 906. The source layer 908 is disposed in the recess 906. The transistor 900 may further include a first buffer layer 910 over the substrate 904. The transistor 900 may further include a barrier layer 912 between the channel layer 902 and the substrate 904. The transistor 900 may further include a first buffer layer 910 over the substrate 904. The transistor 900 may further include a second buffer layer (not shown) over the first buffer layer 910. The transistor 900 may further include a source terminal 914 and a drain terminal 916 over the source layer 908. The transistor 900 may further include a gate stack 918 over the channel layer 902. The gate stack 918 is formed of metal (such as tantalum, tungsten, tantalum nitride, and titanium nitride) and high-k dielectrics. The source layer 908 includes highly doped III-V compounds.

In the exemplary embodiment, the recess 906 may extend from the channel layer 902 to the barrier layer 912. In the exemplary embodiment, the width 928 of the recess 906 may gradually upward increase from near a base 922 of the recess 906 toward a top 936 of the recess 906.

In the exemplary embodiment, a defect 930 in the source layer 908 may occur due to misfit dislocation. The angle 932 between the direction of the defect 930 and the base 922 of the recess 906 may be less than about 60 degrees. In a case that the angle 932 is 60 degrees and the defect 930 grows from the corner, then the depth 924 between a bottom surface 920 of the channel layer 902 and a base 922 of the recess 906 is more than 1.4 times a width 926 of the section 934 of the recess 906 intersecting the bottom surface 920 of the channel layer 902. The defect 930 may not appear above the bottom surface 920 of the channel layer 902 so as to provide good contact between the source layer 908 and the channel layer 902. This lowers the on-resistance of the transistor 900. In another exemplary embodiment, the depth 924 is more than 2 times the width 926. The above are merely exemplary embodiments, and after reading this disclosure, those of ordinary skill in the art will appreciate the other embodiments and possible.

Figure 10:
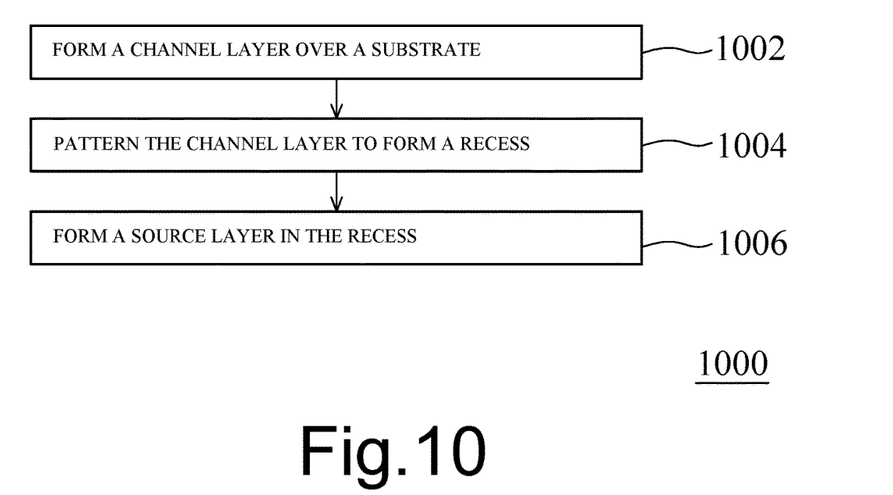
FIG. 10 is a flow chart for forming a transistor according to an exemplary embodiment of the disclosure.

FIG. 10 is a flow chart for forming a transistor according to an exemplary embodiment of the disclosure. As shown in FIG. 10, the method 1000 includes the following operations: forming a channel layer over a substrate (1002); patterning the channel layer to form a recess (1004); and forming a source layer in the recess (1006).

Figure 11:
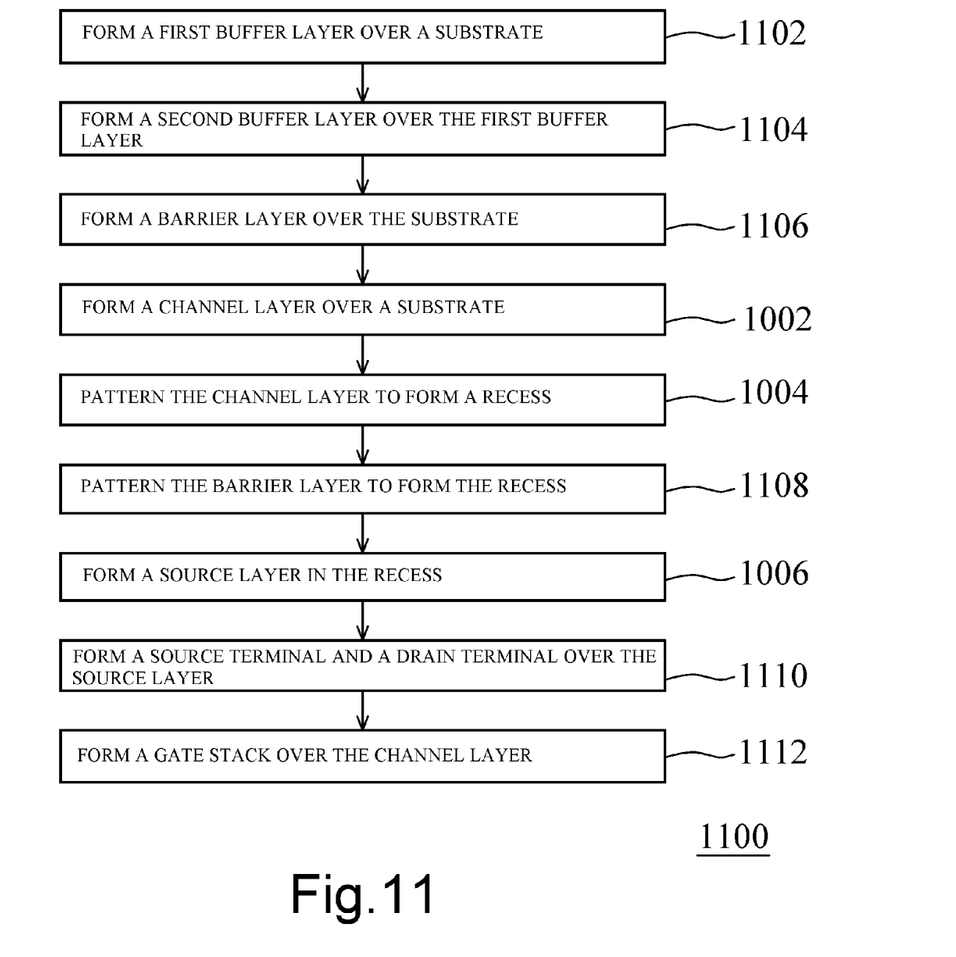
FIG. 11 is a flow chart for forming a transistor according to an exemplary embodiment of the disclosure.

FIG. 11 is a flow chart for forming a transistor according to an exemplary embodiment of the disclosure. As shown in FIG. 11, the method 1100 includes the following operations: forming a first buffer layer over a substrate (1102); forming a second buffer layer over the first buffer layer (1104); forming a barrier layer over the substrate (1106); forming a channel layer over a substrate (1002); patterning the channel layer to form a recess (1004); patterning the barrier layer to form the recess (1108); forming a source layer in the recess (1006); forming a source terminal and a drain terminal over the source layer (1110); and forming a gate stack over the channel layer (1112).

In the exemplary embodiment, the method for forming a transistor further includes: patterning the barrier layer to make a depth between a bottom surface of the channel layer and a base of the recess more than 1.4 times a width of the section of the recess intersecting the bottom surface of the channel layer. In the exemplary embodiment, the method for forming a transistor further includes: patterning the barrier layer to make a depth between a bottom surface of the channel layer and a base of the recess more than 2 times a width of the section of the recess intersecting the bottom surface of the channel layer.

According to an exemplary embodiment of the disclosure, a method for forming a transistor is provided. The method includes: forming a channel layer over a substrate; forming a barrier layer between the channel layer and the substrate; forming a recess that extends into the barrier layer through the channel layer; and forming a source layer in the recess, wherein forming the recess is such that a depth of the recess in the barrier layer is greater than a width of the recess in the channel layer.

According to an exemplary embodiment of the disclosure, a method for forming a transistor is provided. The method includes: forming a channel layer over a substrate; forming a barrier layer between the channel layer and the substrate; forming a recess that extends into the barrier layer between the channel layer and the substrate; forming a recess that extends into the barrier layer through the channel layer; and forming a source layer in the recess such that the source layer in the channel layer has a defect less than a defect of the source layer in the barrier layer.

According to an exemplary embodiment of the disclosure, a method for forming a transistor is provided. The method includes: forming a channel layer over a substrate; forming a barrier layer between the channel layer and the substrate; forming a recess that extends into the barrier layer through the channel layer; forming a source layer in the recess; and forming a buffer layer between the substrate and the barrier layer.

This written description uses examples to disclose the disclosure, include the best mode, and also to enable a person skilled in the art to make and use the disclosure. The patentable scope of the disclosure may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A method for forming a transistor, comprising:
   forming a channel layer over a substrate;
   forming a barrier layer between the channel layer and the substrate;
   forming a recess that extends into the barrier layer through the channel layer; and
   forming a source/drain region in the recess, wherein forming the recess is such that a depth of the recess in the barrier layer is greater than a width of the recess in the channel layer.

2. The method of claim 1, wherein forming the source/drain region is such that the source/drain region in the channel layer has a defect less than a defect of the source/drain region in the barrier layer.

3. The method of claim 1, wherein forming the source/drain region is such that a defect substantially occurs only in the source/drain region in the barrier layer.

4. The method of claim 1, wherein forming the recess is such that the depth of the recess in the barrier layer is more than about 1.4 times the width of the recess in the channel layer.

5. The method of claim 1, wherein forming the recess is such that the depth of the recess in the barrier layer is more than about 2 times the width of the recess in the channel layer.

6. The method of claim 1, further comprising forming a first buffer layer between the substrate and the barrier layer.

7. The method of claim 6, further comprising forming a second buffer layer between the barrier layer and the first buffer layer.

8. The method of claim 1, further comprising forming a source/drain terminal over the source/drain region.

9. The method of claim 1, further comprising forming a gate stack over the channel layer.

10. The method of claim 1, wherein forming the recess is such that the depth of the recess in the barrier layer between a bottom surface of the channel layer and a base of the recess is greater than the width of the recess at the bottom surface of the channel layer.

11. A method for forming a transistor, comprising:
    forming a channel layer over a substrate;

forming a barrier layer between the channel layer and the substrate;

forming a recess that extends into the barrier layer through the channel layer; and forming a source/drain region in the recess such that the source/drain region in the channel layer has a defect less than a defect of the source/drain region in the barrier layer.

12. The method of claim 11, wherein forming the source/drain region is such that the defect substantially occurs only in the source/drain region in the barrier layer.

13. The method of claim 11, further comprising forming a first buffer layer between the substrate and the barrier layer.

14. The method of claim 13, further comprising forming a second buffer layer between the barrier layer and the first buffer layer.

15. The method of claim 11, further comprising forming a source/drain terminal over the source/drain region.

16. The method of claim 11, further comprising forming a gate stack over the channel layer.

17. A method for forming a transistor, comprising:

forming a channel layer over a substrate;

forming a barrier layer between the channel layer and the substrate;

forming a recess that extends into the barrier layer through the channel layer; and forming a source/drain region in the recess, wherein forming the recess is such that a depth of the recess in the barrier layer is more than about 1.4 times a width of the recess in the channel layer.

18. The method of claim 17, wherein forming the source/drain region is such that the source/drain region in the channel layer has a defect less than a defect of the source/drain region in the barrier layer.

19. The method of claim 17, further comprising forming a source/drain terminal over the source/drain region.

20. The method of claim 17, further comprising forming a gate stack over the channel layer.

* * * * *